(12) United States Patent
Hansen et al.

(10) Patent No.: US 11,589,470 B2
(45) Date of Patent: Feb. 21, 2023

(54) PRESSURE RELIEF ARRANGEMENT WITH MAGNETS

(71) Applicant: VESTAS WIND SYSTEMS A/S, Aarhus N (DK)

(72) Inventors: Kenneth G. Hansen, Kjellerup (DK); Hans Christian Bisgaard-Clausen, Holstebro (DK); Dennis Iversen, Hørning (DK)

(73) Assignee: VESTAS WIND SYSTEMS A/S, Aarhus N (DK)

( * ) Notice: Subject to any disclaimer, the term of this patent is extended or adjusted under 35 U.S.C. 154(b) by 320 days.

(21) Appl. No.: 16/770,042

(22) PCT Filed: Nov. 7, 2018

(86) PCT No.: PCT/DK2018/050288
§ 371 (c)(1),
(2) Date: Jun. 4, 2020

(87) PCT Pub. No.: WO2019/110059
PCT Pub. Date: Jun. 13, 2019

(65) Prior Publication Data
US 2020/0296848 A1 Sep. 17, 2020

(51) Int. Cl.
*H02B 13/02* (2006.01)
*H05K 5/02* (2006.01)
(Continued)

(52) U.S. Cl.
CPC ......... *H05K 5/0226* (2013.01); *F03D 80/82* (2016.05); *H02B 13/025* (2013.01); *H05K 5/03* (2013.01); *H05K 5/061* (2013.01)

(58) Field of Classification Search
None
See application file for complete search history.

(56) References Cited

U.S. PATENT DOCUMENTS 4,180,177 A * 12/1979 Gunderman ............. H05K 5/04
220/88.1
5,461,831 A * 10/1995 Michal ..................... E04B 1/98
49/478.1
(Continued)

FOREIGN PATENT DOCUMENTS

CN 206023023 U 3/2017
DE 1803201 U 12/1959
(Continued)

OTHER PUBLICATIONS

PCT Notification of Transmittal of the International Search Report and the Written Opinion of the International Searching Authority, or the Declaration for Application No. PCT/DK2018/050288 dated Jan. 15, 2019.
(Continued)

Primary Examiner — Courtney L Smith
(74) Attorney, Agent, or Firm — Patterson + Sheridan, LLP

(57) ABSTRACT

A cabinet For electronic components, the cabinet comprising an outer wall, a closure, and an attachment structure, the cuter wall encapsulating an internal space and forming an opening, the closure being attached to the outer wall by the attachment structure, and the attachment structure allowing movement of the closure relative to the outer wall between an open position where the opening is uncovered and a closed position where the opening is covered by the closure. To enable automatic and fast opening of the cabinet in case of over pressure, e.g. caused by arching of electronic components in the cabinet, the cabinet Further comprises a magnet structure comprising at least one magnet arranged to hold the closure in the closed position and to release the closure in response to a pressure in the internal space.

16 Claims, 3 Drawing Sheets

(51) Int. Cl.
  *F03D 80/80* (2016.01)
  *H05K 5/06* (2006.01)
  *H02B 13/025* (2006.01)
  *H05K 5/03* (2006.01)

(56) References Cited

U.S. PATENT DOCUMENTS

| | | | |
|---|---|---|---|
| 10,375,843 B2* | 8/2019 | Boily | H02B 13/025 |
| 11,159,000 B2* | 10/2021 | Hawkins | H01H 33/04 |
| 2004/0172889 A1* | 9/2004 | Eijkelenberg | F16K 17/162 |
| | | | 52/99 |
| 2006/0065308 A1* | 3/2006 | Rogge | F24F 11/72 |
| | | | 137/527 |
| 2013/0026139 A1* | 1/2013 | Becker | F03D 13/20 |
| | | | 218/157 |
| 2013/0143478 A1* | 6/2013 | Arcos | H01H 33/08 |
| | | | 454/184 |
| 2015/0188253 A1* | 7/2015 | Tada | H01R 13/6205 |
| | | | 439/39 |
| 2016/0042896 A1* | 2/2016 | Kingston | H02B 1/565 |
| | | | 218/157 |
| 2016/0268783 A1* | 9/2016 | Jordan, PE | H02B 1/28 |
| 2017/0064863 A1* | 3/2017 | Zeng | H05K 5/0213 |

FOREIGN PATENT DOCUMENTS

| | | |
|---|---|---|
| WO | 2016130248 A1 | 8/2016 |
| WO | 2016156369 A1 | 10/2016 |
| WO | 2017114787 A1 | 7/2017 |
| WO | 2019110059 A1 | 6/2019 |

OTHER PUBLICATIONS

Danish Patent and Trademark Office, 1st Technical Examination of Patent Application PA201770909, dated Apr. 18, 2018.

European Patent Office, Communication pursuant to Article 94(3) EPC for Application 18 800 852.8-1201 dated May 16, 2022.

* cited by examiner

PRESSURE RELIEF ARRANGEMENT WITH MAGNETS

INTRODUCTION

A cabinet is provided for electric components such as converters, switchgear, and transformers, e.g. in a wind turbine. The cabinet comprises an outer wall, a closure, and an attachment structure. The outer wail encapsulates an internal space for the electric components and forms an opening and the closure is attached to the outer wall by the attachment structure which prevents complete separation of the closure and outer wall and allows movement of the closure relative to the outer wall between an open position where the opening is uncovered and a closed position where the opening is covered by the closure.

BACKGROUND

Cabinets for electric components such as for switchgear, converters, transformers and similar low or high voltage applications are made in different shapes and sizes, and to meet different requirements e.g. relative to corrosion resistance, the enclosure's ability to withstand prolonged exposure to humidity or chemical substances, and to the ability to withstand a rapid pressure increase or internal explosion, e.g. caused by arching in the cabinet. The cabinets are typically rated according to different standards and in accordance with the intended use.

Typically, the cabinets are prepared for arching by including in the cabinet, an arc-vent. Often, the arc-vent comprises a throttle or damper in a duct leading an excessive pressure out of the cabinet. Due to such arc--vents, even a rapid pressure increase or explosion may take place without destruction of the cabinet, and the potentially hot air is released in a controlled manner at a predetermined location.

DESCRIPTION

It is an object to allow arc venting in electronic encapsulation.

Accordingly, in a first aspect, a cabinet is provided wherein the cabinet comprises a magnet structure comprising at least one magnet arranged to hold the closure in the dosed position and to release the closure in response to a pressure in the internal space.

Due to the magnet structure, the closure will be allowed to open without destruction upon small pressure variations, e.g. due to small arches in the electric system contained in the cabinet. In such situations, the increasing pressure will exceed the closing force of the magnets and the release of the closure will stabilise the pressure. Subsequently, the closure may easily be closed again by use of the magnets. The magnets may further provide a good opening characteristic, e.g. compared to the characteristic of a spring. In contrast to a spring which provides an increasing force for an increasing deflection, the magnet may maintain the closure in the closed position and require a relatively strong opening force to break the magnetic path. Once the magnetic path is open, the force provided by the magnet against further opening may be reduced very swiftly and already for a small opening gap of the magnetic path, the force may be low. Compared to opening of a closure against the force of a spring where the force increases with the opening degree, the magnet thereby enables the closure to swing open very fast once the opening force is exceeded and the magnetic path is broken.

Further potential benefits obtainable by the magnet structure includes that the cabinet may become essentially maintenance free. Need for scheduled or random service can be reduced, and since magnets are supposed to maintain their magnet attraction force, compared to springs which tend to get weaker over time, the lifetime can be increased. Magnet are also mechanically more robust compared to a many alternative solutions.

Upon experience of a burst caused by a large arching or short circuiting in the cabinet, the closure could become damaged, but in that case, repair of the internal components are typically needed and the repair of the cabinet is of minor importance.

The at least one magnet could comprise one or more magnets of the same or different type, e.g. including magnets based on neodymium or ferritic material, or at least one magnet could be an electro-magnet driven by electrical power to thereby enable easy opening of the closure e.g. during maintenance, or in response to malfunctions in electronics 17 in the cabinet.

The outer wall may e.g. hermetically seal the internal space until the closure is moved away from the closed position. The outer wall may e.g. provide a water tight encapsulation, or a vapour tight encapsulation until the closure moves to the open position.

The closure could be configured to move to the closed position when not being biased away from the closed position. In practise, this function may be caused passively without use of power or actively by use of power.

The passive function could particularly be implemented in an embodiment where the attachment structure forms a hinge structure. In that case, the passive function can be based on gravity. In this case, the hinge is arranged high relative to the closure, and particularly above a centre of gravity of the closure, such that the closure falls back to the closed position by use of gravity.

The passive function could also be based on magnetic attraction. In that case, at least one of the magnets of the magnet structure may be arranged such that magnetic attraction forces from the magnet pulls the closure towards the closed position.

The active function could be based on an electric motor configured to move the closure towards the closed position. The motor could either constantly bias the closure towards the closed position, or the motor could be configured to activate upon detection of a position of the closure away from the dosed position or upon detection of movement of the closure.

The magnet structure may form a sealing gasket between the outer wail and the closure to thereby provide a sealing encapsulation of the internal space. In one embodiment, the magnet structure forms an elastically deformable, elongated structure arranged along an edge of the opening or along an edge of the closure, e.g. a rubber structure with embedded magnetic material. A specific advantage may be obtained by arranging such a sealing, magnetic, gasket structure along the edge of the opening, and to provide the gasket structure as an continuous, i.e. un-broken line such that it further forms an upward edge preventing water running on the outer wall from entering through the opening.

The cabinet may comprise a limiting structure configured to limit movement, e.g. rotation of the closure relative to the outer wail. The limiting structure may include a fixed stop preventing opening of the closure above a certain opening angle. Particularly the limiting structure may prevent rotation outside a closure range, in which closure range the closure is biased towards the closed configuration by gravity.

In one example, the opening is formed in a surface intended to be horizontal upwards in an intended operational orientation of the cabinet such that the closed position of the closure is a horizontal orientation of the closure. In this example, the cabinet may comprise a limiting structure preventing rotation of the closure above 90 degrees to a position where the closure points vertical upwards. From such a position, the closure may fall back to the closed horizontal orientation by gravity. In another example, the opening is formed in a surface intended to be vertical in an intended operational orientation of the cabinet such that the closed position of the closure is a vertical orientation of the closure. In this example, the attachment structure may particularly be a hinge structure arranged above the closure such that the closure is rotatable from a vertical downwards orientation to a vertical upwards orientation relative to the hinge structure. In this example, the cabinet may comprise a limiting structure preventing rotation of the closure above 180 degrees to a position where the closure points vertical upwards and still is capable of failing back to the closed, vertical downwards position by gravity.

The outer wall may form an outwards flange extending away from the enclosed space and extending circumferentially about the opening. The outwards flange may increase the stiffness of the cabinet at the opening and may also prevent unintended intrusion into the cabinet via the opening. If the closure forms a rim portion which is sized and shaped to enable receipt of the closure within the outwards flange, particularly such that only a small gap, e.g. a gap below 2 mm. is formed between the edge of the closure and the outwards flange, access to the internal space becomes difficult and may require a slim tool insertable into the narrow gap and capable of forcing the closure away from the flange against the force of the magnet structure.

The rim portion of the closure may be weakened to facilitate an easier deformation of the closure. In one example, the rim portion is thinner than a central portion, and in another embodiment score lines or slits are provided from the edge of the closure and partly towards the centre of the closure, e.g. score lines or slits of 1-5 cm. length. Upon large pressure increase in the internal space, the closure may thereby buckle and the ability to provide fast air release may be further increased.

Requirements regarding prevention of ingress of humidity or solid particles into cabinets with electric equipment may sometimes be difficult to comply with.

An inner lining may be attached to the outer wall and may form a mesh between the opening and the closure, when the closure is in the closed position. Herein, the term "ventilation-open inner lining" means any kind of structure which prevents intrusion of solid particles above a certain size and yet allows air to pass. The ventilation open inner lining may e.g. be made as a mesh of filaments or fibres, as a woven or non woven material of filaments or fibres, as a mesh of fibres or wires, as a grid of overlapping elements, e.g. circular or square bars, e.g. of steel etc.

When the closure is open, the ventilation--open inner lining may provide an encapsulation preventing solid particles above a certain size from entering the internal space. The ventilation open inner lining may e.g. comply with the requirements to an IP protection class, e.g. IP1X corresponding to prevention of entrance of large body parts, or IP2X prevention of fingers and elements above 12.5 mm in diameter, or IP3X, prevention of tools up to 2.5 mm in diameter, or IP4X from 1 to 2.5 mm, or IP5X which corresponds to a mesh of a size below 1 mm in diameter.

The inner lining may particularly he arranged directly adjacent the inner surface of the closure when the closure is in the closed position such that the inner lining supports the closure and prevents unintended deformation which could lead to opening of the closure e.g. if a user applies pressure against the closure by stepping onto the cabinet or by placing heavy items onto the cabinet.

The inner lining may be made such that it provides a higher resistance against deflection than the closure. This means that the inner lining bends less than the closure when the same pressure is applied to the inner lining and to the closure. Further, the inner lining may have a higher tensile strength than the closure, e.g. a tensile strength in the order or 2-3 times the tensile strength of the closure.

The inner lining may also be arranged at a distance from the closure. In that case, it may be an advantage if the distance and the material are provided such that the closure is deflectable by elastic or plastic deformation into contact with the inner lining without movement of the closure to the open position.

The closure, and the outer wall may be formed e.g. from a blank of a sheet material, e.g. from fibre-reinforced polyester or epoxy, or from a blank of metal, e.g. aluminium or steel. In this embodiment, the closure may have a higher sheet thickness than the cuter wall.

The closure attached to the outer wail by the attachment structure. In one embodiment, the attachment structure is a chain, a wire, a robe or any similar simple attachment which prevents complete separation of the closure from the outer wall.

In one series of embodiments, the attachment structure is in the form of a hinge structure. Within this series of embodiments, the closure and the cuter wall could be formed from one and the same blank of a sheet material, and a contour around that part of the blank which forms the closure is cut open. The contour is made non-completely about the closure such that the closure and the outer wall stay connected at one or more bridge portions of the blank at which bridge portions the blank may bend and thus form the hinge structure. In another embodiment, the closure is a separate component attached to the outer wall by one or more hinges, e.g. a piano hinge.

The cabinet may particularly be for electronic components 17 forming a low voltage converter or a switch gear.

The cabinet may form a support surface for supporting the cabinet on ground, and the opening and closure may be horizontal when the cabinet is supported on the support surface.

The closure may form a central portion within a peripheral portion wherein the central portion extends outwards away from the cabinet. This structure may strengthen the closure.

The cabinet may e.g. be used e.g. in a wind turbine 14, e.g. at the foot of the tower 16 or in the nacelle 15.

BRIEF DESCRIPTION OF THE DRAWINGS

The invention will now be described in further detail with reference to the accompanying drawings in which.

DESCRIPTION OF EMBODIMENTS

It should be understood that the detailed description and specific examples, while indicating embodiments of the invention, are given by way of illustration only, since various changes and modifications within the spirit and scope of the invention will become apparent to those skilled in the art from this detailed description.

Figure 1:
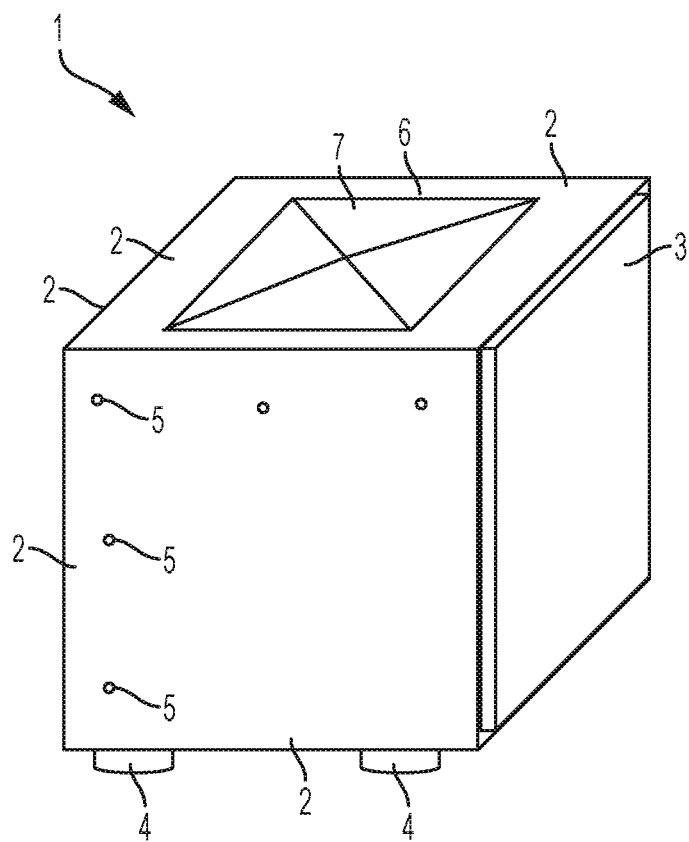
FIG. 1 illustrates a front view of a cabinet according to the invention.

FIG. 1 illustrates a cabinet 1 comprising an outer wall forming five surfaces 2 and a door 3 encapsulating an internal space. The internal space houses different electronic components such as switch gear, converters, transformers, controllers etc.

The cabinet is raised from the floor by the legs 4 forming a support surface for supporting the cabinet on ground.

The cabinet is made from panels of a first sheet material. In the disclosed embodiment, each of the 5 surfaces 2 is constituted by separate panels assembled by screws or rivets 5. Accordingly, wall panels can be replaced individually.

In the embodiment disclosed in FIG. 1, the top panel includes an opening 6 closed by a closure 7 which can move from the illustrated closed position to an open position thereby providing fast ventilation in response to an increased pressure in the internal space.

Figure 2:
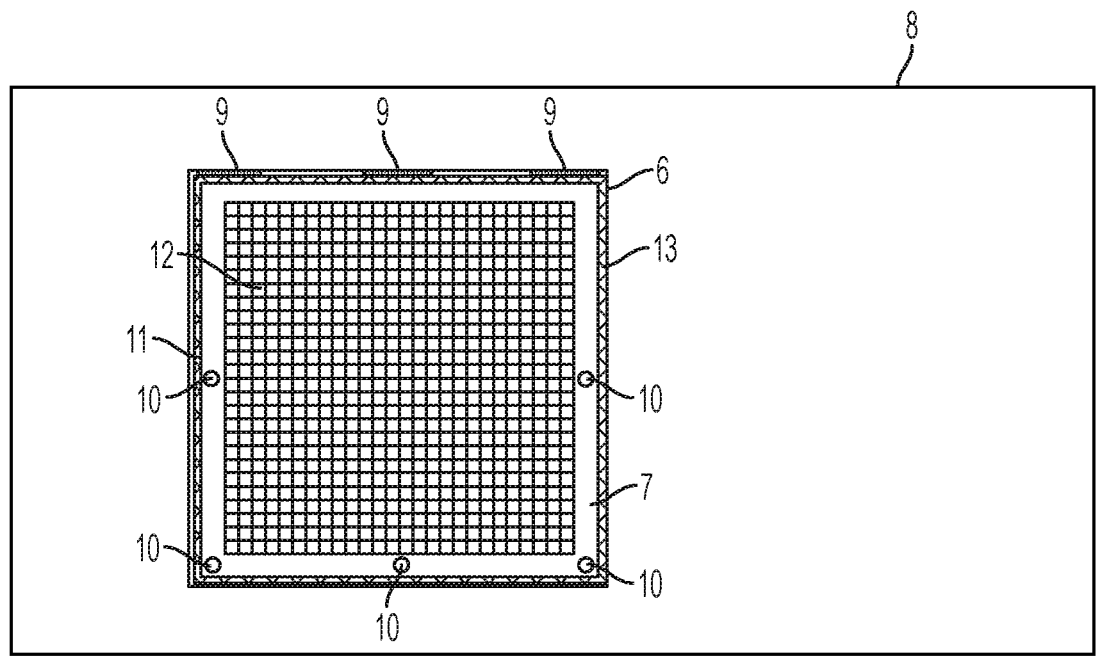
FIG. 2 illustrates a part of the of the outer wail seen from outside the cabinet.

FIG. 2 illustrates a top panel 8 of the outer wall. The top panel forms the opening 6 and the closure 7 is fixed to the panel via hinges 9, e.g. two, three or four hinges, or one single long hinge, e.g. a piano hinge. The closure is maintained in the closed position by the magnets 10, which will release the closure if the pressure in the internal space increases rapidly, e.g. upon arching in the cabinet. When the closure is released, an open window appears through which the excessive gas can escape and thereby relief the pressure.

The interface between the opening in the outer wall and the closure includes a sealing gasket 11 providing a liquid and/or gas tight encapsulation of the internal space. The sealing gasket may include magnet material to provide magnetic attraction along the gasket.

FIG. 2 illustrates the panel 8 seen from outside the cabinet but in a view where the closure is partly transparent thereby illustrating the ventilation-open inner lining 12 arranged in the internal space and covering the opening which will be formed upon movement of the closure away from the closed position. The inner lining has the shape of a mesh e.g. of steel, and it protects against penetration of solid objects and thereby provides an IP1X protection.

The inner lining 12 is held in place by the rigid frame 13 forming a closed rim about the mesh and which forms an outwards flange extending away from the enclosed space and extending circumferentially about the opening. The closure is placed within the flange such that access to the edges of the closure and thus opening of the closure is difficult without special tools.

Figure 3:
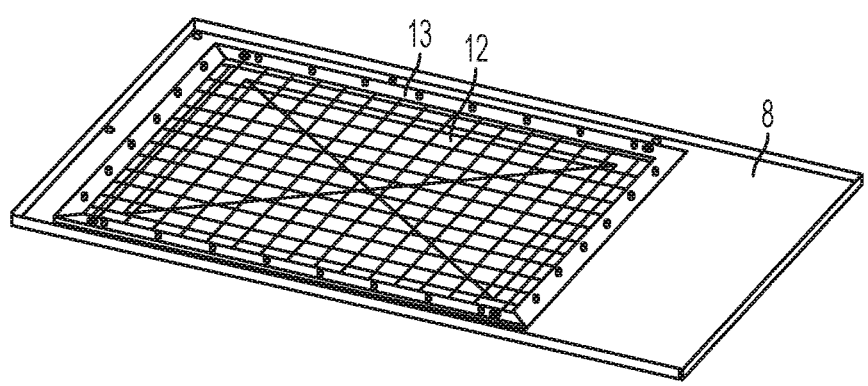
FIG. 3 illustrates a part of the outer wall seen from inside the cabinet.
Figure 4:
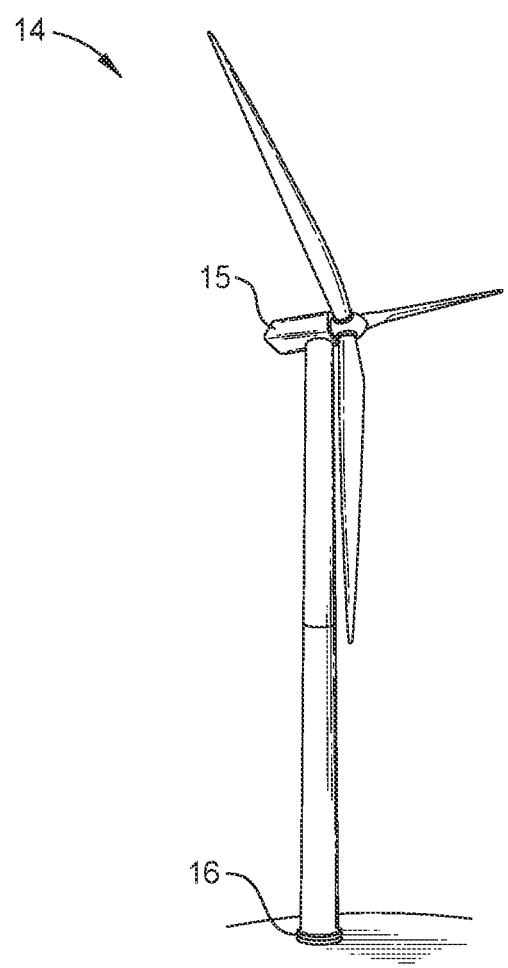
Figure 5:
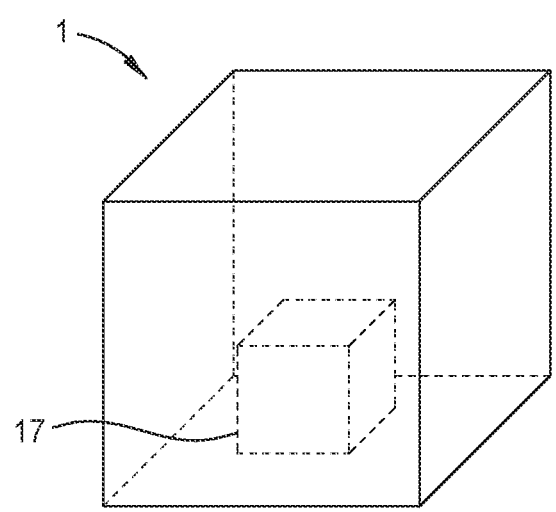

FIG. 3 illustrates the panel 8, the rigid frame 13, and the mesh forming the inner lining 12 seen from inside the cabinet

The invention claimed is:

1. A cabinet for electronic components, the cabinet comprising:
   an outer wall comprising metal, the outer wall defining an opening;
   a closure attached to the outer wall, the closure comprising:
      an attachment structure connecting the closure to the outer wall, the attachment structure allowing movement of the closure relative to the outer wall between an open position where the opening is uncovered and a closed position where the opening is covered by the closure; and
      at least one magnet to magnetically couple the closure to the outer wall to hold the closure in the closed position, wherein the at least one magnet and the closure release from the outer wall to the open position in response to a pressure in the internal space; and
   an inner lining attached to the outer wall and forming a mesh between the opening and the closure, wherein the mesh comprises a grid of overlapping filaments, fibers, or wires.

2. The cabinet according to claim 1, wherein the attachment structure forms a hinge allowing rotation of the closure relative to the outer wall.

3. The cabinet according to claim 1, wherein the closure is configured to move to the closed position when not being biased away from the closed position.

4. The cabinet according to claim 3, wherein the configuration to move to the closed position is provided by at least one magnet of the magnet structure being arranged at the attachment structure.

5. The cabinet according to claim 1, wherein the magnet structure forms a sealing gasket between the outer wall and the closure to thereby provide a sealing encapsulation of the internal space.

6. The cabinet according to claim 1, wherein the outer wall forms an outwards flange extending away from the enclosed space and extending circumferentially about the opening.

7. The cabinet according to claim 6, wherein the closure forms a rim portion being received within the outwards flange.

8. The cabinet according to claim 1, wherein the mesh size provides openings of less than 50 mm2.

9. The cabinet according to claim 1, wherein the inner lining is arranged directly adjacent the closure.

10. The cabinet according to claim 1, wherein inner lining provides a higher resistance against deflection than the closure.

11. The cabinet according to claim 1, wherein the outer wall and the closure are made of blanks of a sheet material, and wherein the closure is made from a blank having a larger sheet thickness than the outer wall.

12. The cabinet according to claim 1, comprising electronic components housed in the internal space.

13. The cabinet according to claim 1, comprising a support structure for supporting the cabinet on ground or for suspending the cabinet on a wall, and wherein the opening is horizontal, when the cabinet is supported by the support structure.

14. A wind turbine, comprising:
   a tower;
   a nacelle disposed on the tower;
   a rotor extending from the nacelle and having a plurality of blades disposed on a distal end; and
   a cabinet for electronic components and disposed proximate to the tower, the cabinet comprising:
      an outer wall comprising metal, the outer wall defining an opening;
      a closure attached to the outer wall, the closure comprising:
         an attachment structure connecting the closure to the outer wall, the attachment structure allowing movement of the closure relative to the outer wall between an open position where the opening is uncovered and a closed position where the opening is covered by the closure; and
         at least one magnet to magnetically couple the closure to the outer wall to hold the closure in the closed position, wherein the at least one magnet and the closure release from the outer wall to the open position in response to a pressure in the internal space; and an inner lining attached to the outer wall and forming a mesh between the opening and the closure, wherein the mesh comprises a grid of overlapping fibers filaments or wires.

15. The wind turbine according to claim 14, wherein the closure is configured to move to the closed position when not being biased away from the closed position.

16. The wind turbine according to claim 15, wherein the configuration to move to the closed position is provided by at least one magnet of the magnet structure being arranged at the attachment structure.

* * * * *